(12) United States Patent
Basceri et al.

(10) Patent No.: US 8,084,142 B2
(45) Date of Patent: Dec. 27, 2011

(54) METHODS OF FORMING CONDUCTIVE CONTACTS TO SOURCE/DRAIN REGIONS AND METHODS OF FORMING LOCAL INTERCONNECTS

(75) Inventors: Cem Basceri, Reston, VA (US); Gurtej S. Sandhu, Boise, ID (US); H. Montgomery Manning, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 1147 days.

(21) Appl. No.: 11/525,762

(22) Filed: Sep. 21, 2006

(65) Prior Publication Data

US 2007/0015359 A1    Jan. 18, 2007

Related U.S. Application Data

(62) Division of application No. 10/932,218, filed on Sep. 1, 2004, now Pat. No. 7,241,705.

(51) Int. Cl.
*H01L 21/44* (2006.01)
*H01L 21/4763* (2006.01)
*H01L 29/40* (2006.01)

(52) U.S. Cl. ........ 428/622; 438/629; 438/672; 438/675; 257/758; 257/759; 257/760; 257/774; 257/E21.203

(58) Field of Classification Search .......... 257/758, 257/759, 760, 774; 438/622, 629, 630, 672, 438/675
See application file for complete search history.

(56) References Cited

U.S. PATENT DOCUMENTS

| | | |
|---|---|---|
| 3,349,474 A | 10/1967 | Rauscher |
| 3,772,101 A | 11/1973 | Chumbres et al. |
| 3,934,057 A | 1/1976 | Moreau et al. |
| 4,086,074 A | 4/1978 | Minot et al. |
| 4,180,596 A | 12/1979 | Crowder et al. |
| 4,622,735 A | 11/1986 | Shibata |
| 4,645,562 A | 2/1987 | Liao et al. |
| 4,683,645 A | 8/1987 | Naguib et al. |
| 4,693,910 A | 9/1987 | Nakajima et al. |
| 4,766,090 A | 8/1988 | Coquin et al. |

(Continued)

FOREIGN PATENT DOCUMENTS

EP    0851473 A2    7/1998

(Continued)

OTHER PUBLICATIONS

Abstract: Basceri et al., *Atomic Layer Deposition for Nanoscale Cu Metalluzation*, 10 pages (pre-Sep. 2003).

(Continued)

*Primary Examiner* — James Mitchell
(74) *Attorney, Agent, or Firm* — Wells St. John P.S.

(57) ABSTRACT

The invention comprises methods of forming a conductive contact to a source/drain region of a field effect transistor, and methods of forming local interconnects. In one implementation, a method of forming a conductive contact to a source/drain region of a field effect transistor includes providing gate dielectric material intermediate a transistor gate and a channel region of a field effect transistor. At least some of the gate dielectric material extends to be received over at least one source/drain region of the field effect transistor. The gate dielectric material received over the one source/drain region is exposed to conditions effective to change it from being electrically insulative to being electrically conductive and in conductive contact with the one source/drain region. Other aspects and implementations are contemplated.

43 Claims, 8 Drawing Sheets

U.S. PATENT DOCUMENTS

| | | | |
|---|---|---|---|
| 5,099,304 | A | 3/1992 | Takemura et al. |
| 5,236,865 | A | 8/1993 | Sandhu et al. |
| 5,275,695 | A | 1/1994 | Chang et al. |
| 5,406,123 | A | 4/1995 | Narayan |
| 5,444,024 | A | 8/1995 | Anjum et al. |
| 5,470,784 | A | 11/1995 | Coleman |
| 5,470,794 | A | 11/1995 | Anjum et al. |
| 5,561,082 | A | 10/1996 | Matsuo et al. |
| 5,670,298 | A | 9/1997 | Hur |
| 5,677,102 | A | 10/1997 | Shiihara |
| 5,904,517 | A | 5/1999 | Gardner et al. |
| 5,955,244 | A | 9/1999 | Duval |
| 5,994,194 | A | 11/1999 | Lammert |
| 5,998,264 | A | 12/1999 | Wu |
| 6,013,582 | A | 1/2000 | Ionov et al. |
| 6,037,239 | A | 3/2000 | Jennings |
| 6,096,621 | A | 8/2000 | Jennings |
| 6,096,634 | A | 8/2000 | Nguyen |
| 6,130,140 | A | 10/2000 | Gonzalez |
| 6,133,105 | A | 10/2000 | Chen et al. |
| 6,133,116 | A | 10/2000 | Kim et al. |
| 6,156,674 | A | 12/2000 | Li et al. |
| 6,165,834 | A | 12/2000 | Agarwal et al. |
| 6,169,019 | B1 | 1/2001 | Takagi |
| 6,177,235 | B1 | 1/2001 | Francou et al. |
| 6,180,465 | B1 | 1/2001 | Gardner et al. |
| 6,188,097 | B1 | 2/2001 | Derderian et al. |
| 6,207,485 | B1 | 3/2001 | Gardner et al. |
| 6,238,994 | B1 | 5/2001 | Derderian et al. |
| 6,255,035 | B1 | 7/2001 | Minter et al. |
| 6,277,709 | B1 | 8/2001 | Wang et al. |
| 6,277,728 | B1 | 8/2001 | Ahn et al. |
| 6,281,100 | B1 | 8/2001 | Yin et al. |
| 6,291,363 | B1 | 9/2001 | Yin et al. |
| 6,297,527 | B1 | 10/2001 | Agarwal et al. |
| 6,350,560 | B1 | 2/2002 | Sahbari |
| 6,376,149 | B1 | 4/2002 | Grober et al. |
| 6,380,611 | B1 | 4/2002 | Yin et al. |
| 6,383,723 | B1 | 5/2002 | Iyer et al. |
| 6,399,982 | B1 | 6/2002 | Derderian et al. |
| 6,440,793 | B1 | 8/2002 | Divakaruni et al. |
| 6,465,325 | B2 | 10/2002 | Ridley et al. |
| 6,511,896 | B2 | 1/2003 | Basceri et al. |
| 6,548,854 | B1 | 4/2003 | Kizilyalli et al. |
| 6,582,861 | B2 | 6/2003 | Buxbaum et al. |
| 6,582,888 | B1 | 6/2003 | Herbst et al. |
| 6,608,343 | B2 | 8/2003 | Derderian et al. |
| 6,613,240 | B2 | 9/2003 | Skinner et al. |
| 6,617,250 | B2 | 9/2003 | Basceri et al. |
| 6,649,466 | B2 | 11/2003 | Basceri et al. |
| 6,720,638 | B2 | 4/2004 | Tran |
| 6,744,093 | B2 | 6/2004 | Agarwal et al. |
| 6,746,916 | B2 | 6/2004 | Agarwal et al. |
| 6,753,618 | B2 | 6/2004 | Basceri et al. |
| 6,770,501 | B2 * | 8/2004 | Burnham et al. ............ 438/38 |
| 6,777,739 | B2 | 8/2004 | Agarwal et al. |
| 6,780,728 | B2 | 8/2004 | Tran |
| 6,780,766 | B2 | 8/2004 | Basceri et al. |
| 6,794,721 | B2 * | 9/2004 | Clevenger et al. .......... 257/369 |
| 6,817,086 | B2 | 11/2004 | Lu et al. |
| 6,838,363 | B2 | 1/2005 | Wieczorek et al. |
| 6,844,131 | B2 | 1/2005 | Oberlander et al. |
| 6,900,497 | B2 | 5/2005 | Agarwal et al. |
| 6,943,126 | B1 | 9/2005 | Narayanan et al. |
| 6,956,980 | B2 | 10/2005 | Nagata et al. |
| 6,969,677 | B2 | 11/2005 | Derderian et al. |
| 7,026,243 | B2 | 4/2006 | Basceri |
| 7,265,406 | B2 | 9/2007 | Kellar et al. |
| 2001/0006759 | A1 | 7/2001 | Shipley, Jr. et al. |
| 2002/0064969 | A1 | 5/2002 | Havemann |
| 2002/0076879 | A1 | 6/2002 | Lee et al. |
| 2002/0196651 | A1 | 12/2002 | Weis |
| 2003/0013272 | A1 | 1/2003 | Hong et al. |
| 2003/0045060 | A1 | 3/2003 | Ahn et al. |
| 2003/0045078 | A1 | 3/2003 | Ahn et al. |
| 2003/0205729 | A1 | 11/2003 | Basceri et al. |
| 2003/0211729 | A1 | 11/2003 | Lee et al. |
| 2003/0213987 | A1 | 11/2003 | Basceri et al. |
| 2003/0219942 | A1 | 11/2003 | Choi et al. |
| 2004/0043228 | A1 | 3/2004 | Derderian et al. |
| 2004/0046197 | A1 | 3/2004 | Basceri et al. |
| 2004/0219736 | A1 | 11/2004 | Yoshitaka |
| 2004/0224471 | A1 | 11/2004 | Clevenger et al. |
| 2004/0245559 | A1 | 12/2004 | Pontoh et al. |
| 2004/0245560 | A1 | 12/2004 | Pontoh et al. |
| 2005/0035460 | A1 | 2/2005 | Tseng |
| 2005/0244571 | A1 | 11/2005 | Walheim et al. |
| 2005/0266619 | A1 | 12/2005 | Brask et al. |
| 2005/0266664 | A1 | 12/2005 | Harrison et al. |
| 2005/0285213 | A1 * | 12/2005 | Datta et al. ................ 257/411 |
| 2006/0183277 | A1 | 8/2006 | Brask et al. |

FOREIGN PATENT DOCUMENTS

| | | |
|---|---|---|
| JP | 2002-323775 | 11/2002 |

OTHER PUBLICATIONS

Chang et al., *Silicon surface treatments in advanced MOS gate processing*, 72 Microelectronic Engineering, pp. 130-135 (2004).

En et al., *Plasma immersion ion implantation reactor design considerations for oxide charging*, 85 Surface and Coatings Technology, pp. 64-69 (1996).

Ku et al., *The Application of Ion Beam Mixing, Doped Silicide, and Rapid Thermal Processing to Self-Aligned Silicide Technology*, 137 J. Electrochem Soc., No. 2, pp. 728-740 (Feb. 1990).

Lemberger et al., *electrical characterization and reliability aspects of zirconium silicate films obtained from novel MOCVD precursors*, 72 Microelectronic Engineering, pp. 315-320 (2004).

Abstract: Lin et al., *How to Eliminate Voiding in Porous Low-k Dielectrics and the Mechanism of Void Formation*, 4 pages (pre-Sep. 2003).

Lu et al., *Effects of the $TaN_x$ interface layer on doped tantalum oxide high-k films*, J. Vacuum, 9 pages (Elsevier Ltd, 2004).

Park et al., *COB Stack DRAM Cell Technology beyond 100 nm Technology Node (invited paper)*, 3 pages, (pre-Sep. 2003).

Robertson et al., *Atomic structure, band offsets, growth and defects at high-K oxide:Si interfaces*, 72 Microelectronic Engineering, pp. 112-120 (2004).

Rubin et al., *Shallow-Junction Diode Formation by Implantation of Arsenic and Boron Through Titanium-Silicide Films and . . .* , 37 IEEE Transactions on Electron Devices, No. 1, pp. 183-190 (Jan. 1990).

Singh et al., *High and Low dielectric Constant Materials*, The Electrochemical Society Interface, pp. 26-30 (Summer 1999).

U.S. Appl. No. 10/609,311, filed Jun. 2003, Yates.
U.S. Appl. No. 10/655,997, filed Sep. 2003, Daley.
U.S. Appl. No. 10/689,958, filed Oct. 2003, Basceri.
U.S. Appl. No. 10/879,367, filed Jun. 2004, Blalock et al.
U.S. Appl. No. 10/822,118, filed Apr. 2004, Sandhu et al.
U.S. Appl. No. 10/932,218, filed Sep. 2004, Basceri et al.

* cited by examiner

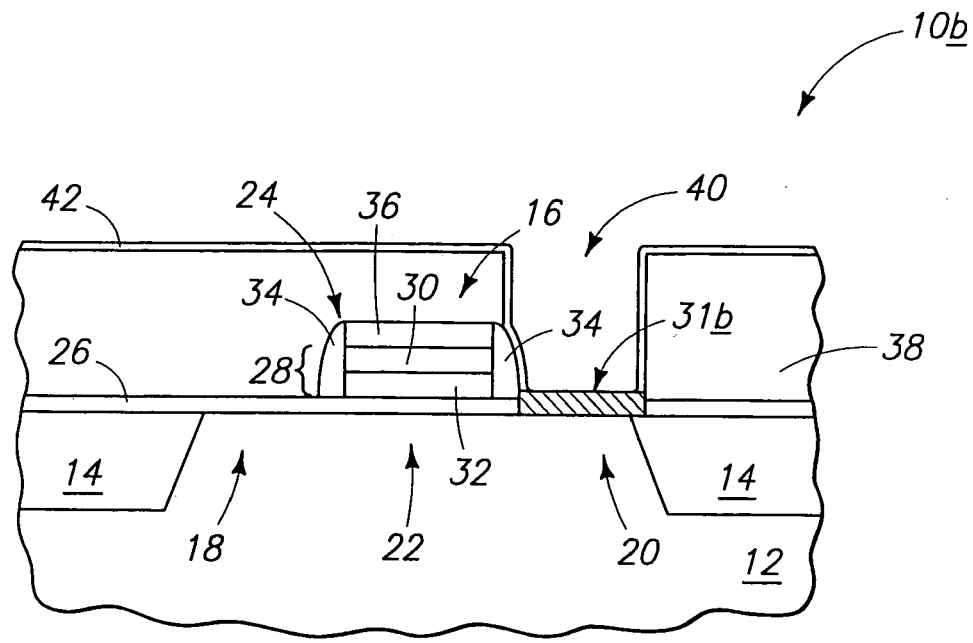
_FIG 7_
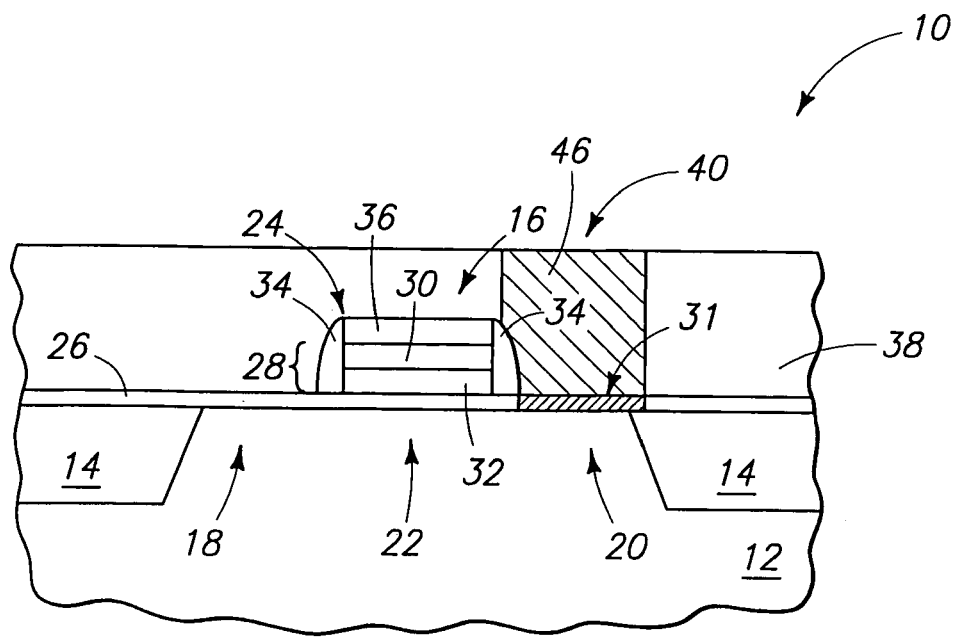
_FIG 8_

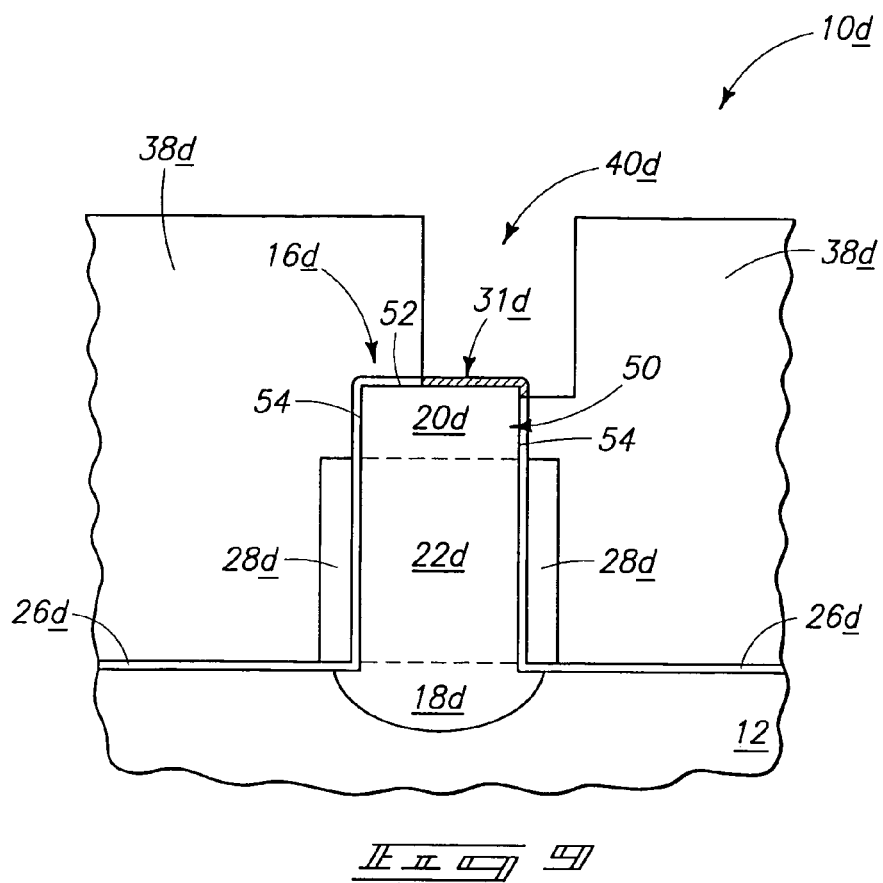
_FIG. 9_
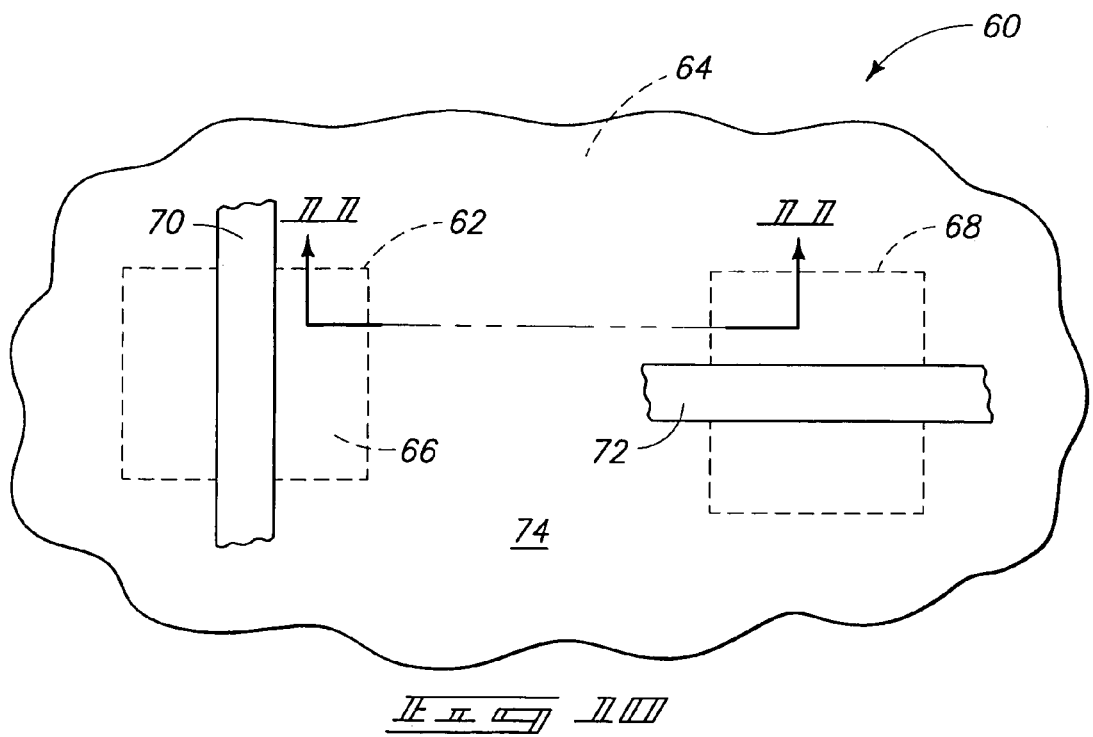
_FIG. 10_

0
METHODS OF FORMING CONDUCTIVE CONTACTS TO SOURCE/DRAIN REGIONS AND METHODS OF FORMING LOCAL INTERCONNECTS

RELATED PATENT DATA

This patent resulted from a divisional application of U.S. patent application Ser. No. 10/932,218, filed Sep. 1, 2004, now U.S. Pat. No. 7,241,705 entitled "Methods of Forming Conductive Contacts to Source/Drain Regions and Methods of Forming Local Interconnects", naming Cem Basceri, Gurtej S. Sandhu and H. Montgomery Manning as inventors, the disclosure of which is incorporated by reference.

TECHNICAL FIELD

This invention relates to methods of forming conductive contacts to source/drain regions of field effect transistors, and to methods of forming local interconnects.

BACKGROUND OF THE INVENTION

Integrated circuitry includes a plurality of different type of electronic components or devices, some of which electrically connect with one another and others of which are electrically isolated from one another. By way of example only, exemplary devices include field effect transistors, capacitors and conductive lines. Field effect transistors are commonly composed of a pair of source/drain regions having a switchable channel region formed therebetween which is controlled by a conductive gate. Conductive electrical contact is typically made to one or both of the source/drain regions to connect the transistor with other integrated circuitry devices.

Conductive lines, for example transistor gate lines, can extend or run globally over large areas of a substrate comprising the integrated circuitry. Some conductive lines are much shorter and associated with very small portions of integrated circuitry, and are typically referred to as local interconnects. For example, and by way of example only, some local interconnects electrically connect source/drain regions of different field effect transistors. Further by way of example only, some local interconnects electrically connect a source/drain region of one transistor with a gate of another transistor. Further by way of example only, local interconnects are utilized to connect different conductive node regions of the integrated circuitry which do not necessarily constitute any portion of a field effect transistor.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention comprises methods of forming a conductive contact to a source/drain region of a field effect transistor, and methods of forming local interconnects. In one implementation, a method of forming a conductive contact to a source/drain region of a field effect transistor includes providing gate dielectric material intermediate a transistor gate and a channel region of a field effect transistor. At least some of the gate dielectric material extends to be received over at least one source/drain region of the field effect transistor. The gate dielectric material received over the one source/drain region is exposed to conditions effective to change it from being electrically insulative to being electrically conductive and in conductive contact with the one source/drain region.

In one implementation, a method of forming a local interconnect includes providing gate dielectric material intermediate a transistor gate and a channel region of a field effect transistor over a semiconductor substrate. At least some of the gate dielectric material extends to be received between first and second node regions of the semiconductor substrate. The gate dielectric material received between the first and second node regions is exposed to conditions effective to change it from being electrically insulative to being electrically conductive and a local interconnect is formed from the changed material which electrically connects the first and second node regions.

In one implementation, a method of forming a local interconnect includes providing capacitor dielectric material proximate a first capacitor electrode over a semiconductor substrate. At least some of the capacitor dielectric material extends to be received between first and second node regions of the semiconductor substrate. The capacitor dielectric material received between the first and second node regions is exposed to conditions effective to change it from being electrically insulative to being electrically conductive and a local interconnect is formed from the changed material which electrically connects the first and second node regions.

Other aspects and implementations are contemplated.

BRIEF DESCRIPTION OF THE DRAWINGS

Preferred embodiments of the invention are described below with reference to the following accompanying drawings.

FIG. 7 is a view of the FIG. 6 substrate at a processing step subsequent to that depicted by FIG. 6.

FIG. 8 is a view of the FIG. 4 substrate at a processing step subsequent to that depicted by FIG. 4.

FIG. 9 is a diagrammatic cross section of a substrate fragment in process in accordance with an aspect of the invention.

FIG. 10 is a diagrammatic top plan view of a substrate fragment in process in accordance with an aspect of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
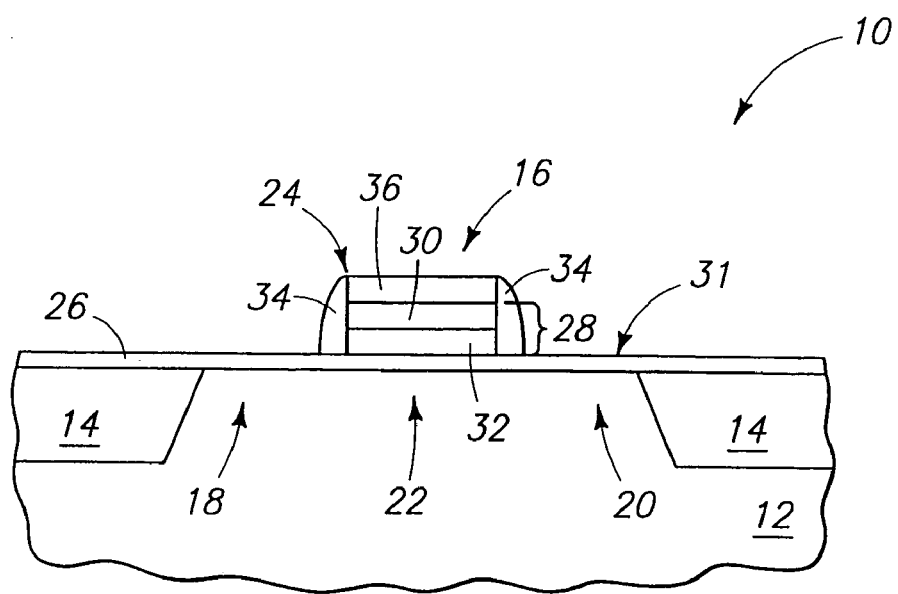
FIG. 1 is a diagrammatic cross section of a substrate fragment in process in accordance with an aspect of the invention.

By way of example only, exemplary preferred implementations of methods of forming a conductive contact to a source/drain region of a field effect transistor are initially described with reference to FIGS. 1-9. Referring initially to FIG. 1, a semiconductive substrate fragment is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. In the depicted exemplary preferred embodiment, fragment 10 comprises bulk semiconductive substrate material 12, for example monocrystalline silicon, having trench isolation oxide regions 14 formed therein. Of course, semiconductor-on-insulator circuitry fabrication, as well as other circuitry fabrication whether existing or yet-to-be developed, is also contemplated. Exemplary materials for trench isolation regions 14 include one or both of silicon dioxide and silicon nitride.

Substrate fragment 10 comprises a field effect transistor 16 in fabrication. Such is depicted as comprising source/drain regions 18 and 20, and a channel region 22 therebetween in fabrication within semiconductive material 12. A transistor gate construction 24 is received operably proximate channel region 22, with a gate dielectric material 26 being provided over semiconductor substrate 12/14 intermediate transistor gate construction 24 and channel region 22. By way of example only, gate construction 24 is depicted as comprising a conductive transistor gate portion 28 comprised of two conductive layers, for example a metal or metal silicide layer 30 received over conductively doped polysilicon 32. Gate construction 24 is also depicted as comprising insulative sidewall spacers 34 and an insulative cap 36, for example comprised of silicon nitride. The depicted construction is exemplary only, and of course, other constructions are contemplated (whether existing or yet-to-be developed), and further by way of example only, the exemplary spacers and insulative cap (if used) might not be fabricated at this portion in the process. Further, at this point in the process, source/drain regions 18 and 20 (and channel 22) might or might not be effectively conductively doped with a conductively enhancing impurity, and further by way of example only, might constitute elevated source/drains and/or conductive metal and/or conductive metal compounds. In the depicted example, field effect transistor 16 is formed over a semiconductor substrate 12/14 and is oriented generally horizontally relative thereto, although of course other orientations are contemplated.

At least some of gate dielectric material 26 extends to be received over at least one of source/drain regions 18 and 20 of field effect transistor 16, with material 26 extending to be received over both such source/drain regions in the depicted example. Further in the exemplary preferred embodiment, all of the elevational thickness of gate dielectric material 26 extends to be received over the source/drain region or regions. An exemplary preferred thickness range for gate dielectric material 26 is from 5 Angstroms to 100 Angstroms. Preferably, extending gate dielectric material 26 is a high k dielectric material having a dielectric constant of at least 8. By way of example only, preferred gate dielectric materials 26 include metal oxides, for example any one or a combination of hafnium oxide, aluminum oxide, tantalum oxide, zirconium oxide and titanium oxide (and including silicates of hafnium, aluminum, tantalum, zirconium and titanium), to name a few. Other gate dielectric materials are, of course, also contemplated, and whether existing or yet-to-be developed. For purposes of the continuing discussion, gate dielectric material 26 can be considered as having an extending portion 31 received over source/drain region 20.

Figure 2:
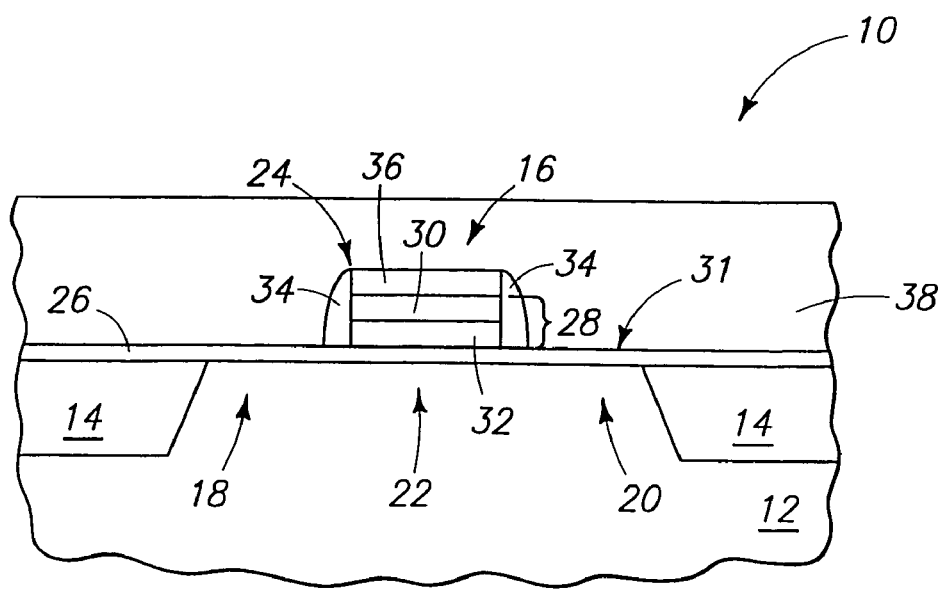
FIG. 2 is a view of the FIG. 1 substrate at a processing step subsequent to that depicted by FIG. 1.

Referring to FIG. 2, a dielectric layer 38 has been formed over transistor gate 16 and source/drain regions 18 and 20. By way of example only, discussion proceeds with respect to the one source/drain region 20 for the formation of a conductive contact thereto, although alternately or likely in addition thereto a conductive contact would also be made to source/drain region 18. Exemplary preferred materials for dielectric layer 38 include one or a combination of doped and undoped oxides, for example silicon dioxide and borophosphosilicate glass (BPSG) and phoshosilicate glass (PSG).

Figure 3:
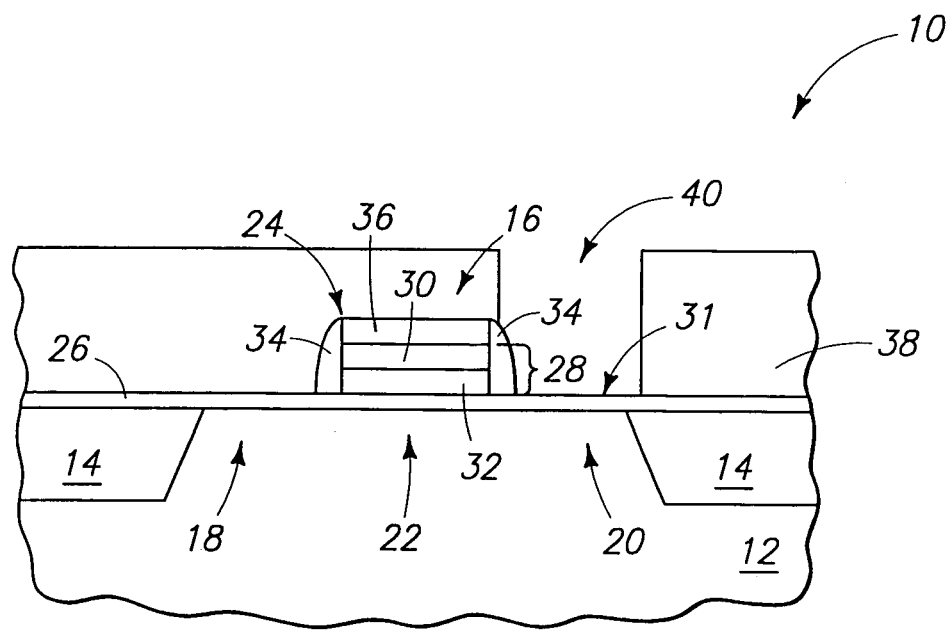
FIG. 3 is a view of the FIG. 2 substrate at a processing step subsequent to that depicted by FIG. 2.

Referring to FIG. 3, a contact opening 40 has been formed into dielectric layer 38 to extending portion 31 received over source/drain region 20 of extending gate dielectric material 26. By way of example only, such can be formed by photolithographic patterning and etch. Extending portion 31 might function as an etch stop in forming contact opening 40.

Figure 4:
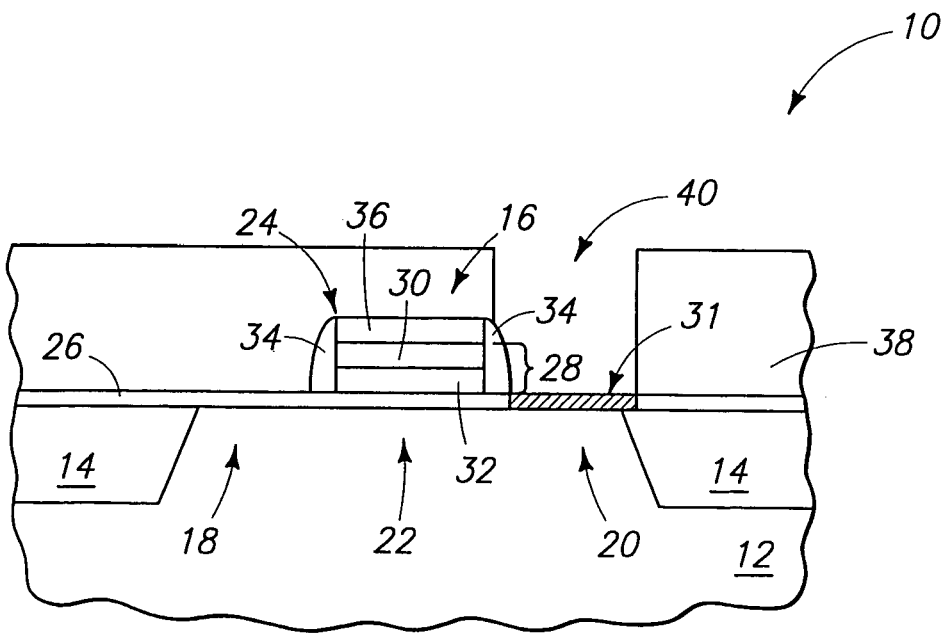
FIG. 4 is a view of the FIG. 3 substrate at a processing step subsequent to that depicted by FIG. 3.

Referring to FIG. 4, extending portion 31 of gate dielectric material 26 received over source/drain region 20 has been exposed to conditions effective to change it from being electrically insulative to being electrically conductive and in conductive contact with source/drain region 20. By way of example only, the exposing might be effective to form extending material 31 to be transformed to one or both of an elemental metal and/or a conductive metal compound. By way of example only, exemplary metal compounds include conductive metal nitrides, conductive metal borides, conductive metal silicides, conductive metal oxides, conductive metal carbides, conductive metal halides and conductive metal sulfides. Further by way of example only, such exposing might include plasma, or alternately be void of exposure to plasma. Further, such exposing might include ion implantation with or without (or in combination with) plasma exposure. Further by way of example only where plasma exposure is utilized and where the extending gate dielectric material comprises a metal oxide, the plasma exposure might comprise at least some exposure to a reaction-inert material which breaks metal-oxygen bonds of the metal oxide to facilitate transformation to a conductive material, for example exposure to an argon and/or $H_2$ and/or other reducing gas-comprising plasma. For ion implantation, exemplary ion implantation species include H, N, Ar, $H_2$, $NH_2^+$, B plus H, and $BF_2$ plus H, and/or elements and/or compounds with higher affinity that the matrix metal or material (i.e., Ru, Ir) which can facilitate the breaking of metal-oxygen bonds, drive oxygen from the layer and transform the material to one or both of elemental metal or a conductive metal compound.

By way of example only, the above exemplary preferred metal oxide dielectric materials might be transformed to conductive metal nitrides, conductive metal borides or conductive elemental metals of the metal oxides. For example, exposure of such materials to a nitrogen containing atmosphere ($N_2$ and/or $NH_3$), preferably including plasma species thereof at a preferred temperature range of from 500° C. to 900° C. and at a preferred pressure range of from 1 mTorr to atmospheric and above pressures, can be utilized to form conductive metal nitride (i.e., HfN, TaN, AlN and/or TiN) extending portions 31. If a hydrogen species, for example $H_2$, were utilized in place of $N_2$ or $NH_3$, the exposure could be conducted for a time period effective to reduce the metal oxides all the way back to there elemental metals, including alloys thereof (i.e., Hf, Ta, Al and/or Ti). Exemplary exposure to $B_2H_6$ could be utilized to form conductive metal borides. Further by way of example only, the exposing could include forming the extending material to comprise an elemental metal followed by exposure to a reactive one of a nitride and/or boron containing material to form a conductive metal nitride and/or conductive metal boride.

Further by way of example where a silicide is desired to be formed, such might result from one or both of exposure to a silicon-comprising atmosphere, and/or from the reaction of metal of the extending gate dielectric material with silicon of the one source/drain region where such comprises silicon.

Figure 5:
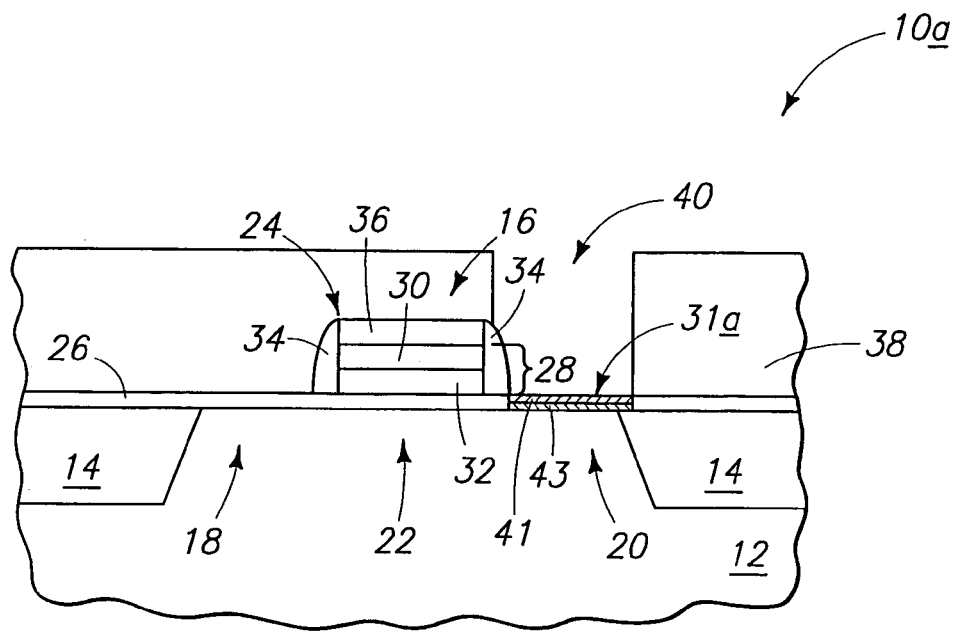
FIG. 5 is an alternate view to that of FIG. 4 of the FIG. 3 substrate at a processing step subsequent to that depicted by FIG. 3.

FIG. 4 depicts forming extending material 31 to be homogeneous. By way of example only, FIG. 5 depicts an alternate exemplary embodiment substrate fragment 10a. Like numerals from the first described embodiment are utilized where appropriate, with differences being indicated with the suffix "a" or with different numerals. FIG. 5 depicts extending material 31a as not being homogeneous, and comprising a first conductive outer material 41 and a different conductive inner material 43. By way of example only, material 41 might comprise a conductive metal nitride with material 43 comprising a conductive metal silicide, for example formed by any of the above-described methods. Of course, combinations of elemental metals (which include alloys thereof) and conductive metal compounds (including conductively doped semiconductive materials) are also contemplated.

Figure 6:
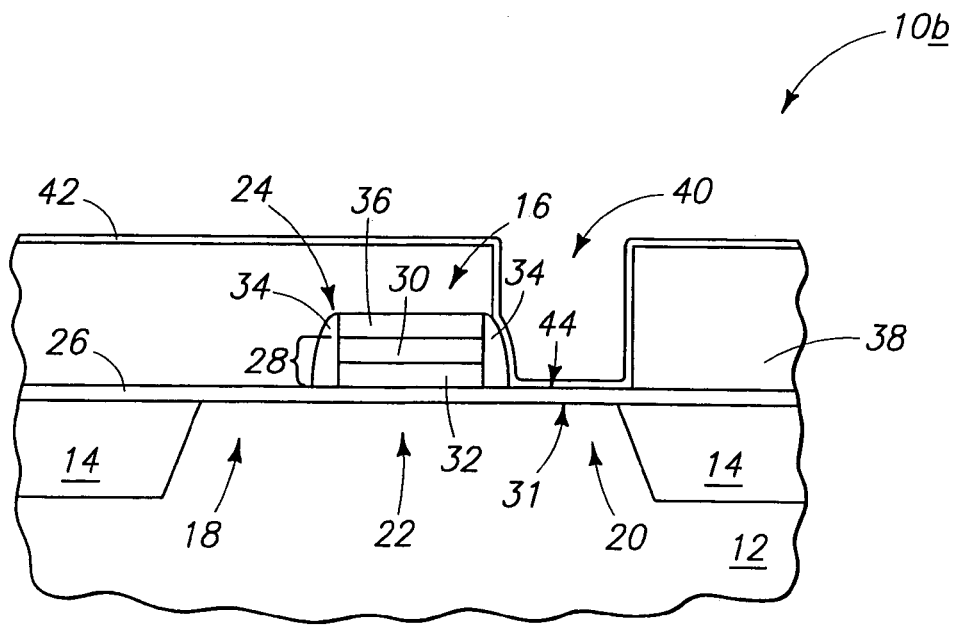
FIG. 6 is another alternate view to that of FIG. 4 of the FIG. 3 substrate at a processing step subsequent to that depicted by FIG. 3.

The exposing of gate dielectric material received over source/drain region 20 to change it from being electrically insulative to being electrically conductive also preferably, by way of example only, includes methods as described in our U.S. patent application Ser. No. 10/822,118, filed Apr. 8, 2004, which is now U.S. Patent Application Publication No. 2005/0227487, the application of which is herein fully incorporated by reference. Exemplary preferred methods are, by way of example only, described with reference to FIGS. 6 and 7 with respect to a substrate fragment 10b. Like numerals from the first described embodiment are utilized where appropriate, with differences being indicated with the suffix "b" or with different numerals. FIG. 6 depicts the deposition of another material 42 over extending gate dielectric material 31, with such another material being different in composition from that of extending gate dielectric material 31. By way of example only where gate dielectric material 26/31 comprises a metal oxide, exemplary materials 42 include Ti, Ta, and Ru. Pursuant to the patent application incorporated by reference, extending gate dielectric material 31 and the other material 42 can be considered as being received proximate one another at an interface 44 which, in the depicted preferred embodiment, is in a contacting relationship, although such is not required in accordance with the application incorporated by reference. Extending gate dielectric material 31 and the another material 42, as being proximate one another at interface 44, are capable of reacting with one another at some minimum reaction temperature when in an inert non-plasma atmosphere at a pressure. Interface 44 is provided at a processing temperature which is at least 50° C. below the minimum reaction temperature and at the pressure.

Referring to FIG. 7, and with interface 44 (not shown) at the processing temperature and at the pressure, substrate 10b has been exposed to a plasma effective to impart a reaction of extending gate dielectric material 31 with the another material 42 to form a reaction product third material 31b which is in conductive contact with source/drain region 20. The application incorporated by reference did not transform all of the underlying material to a new material. However and by way of example only, increasing the processing time, temperature, pressure, plasma and/or ion implantation dose or energy intensity, including any combinations thereof, can be conducted effective to transform all of the underlying gate dielectric material 26 extending to over source/drain region 20 to be transformed to a conductive material. Preferred attributes and other aspects are otherwise preferably as described in the application incorporated by reference above.

Referring to FIG. 8, conductive material 46 has been provided within contact opening 40 in electrical connection with source/drain region 20 through changed extending material 31 of substrate fragment 10. Exemplary preferred materials 46 include metals, conductive metal compounds and/or conductively doped semiconductive material. Conductive material 46 might be the same as or different in composition from that of changed extending material 31. Further by way of example only, conductive material 46 might be provided within contact opening 40 before or after the exposing effective to transform extending material 31 to a conductive material.

The above exemplary preferred and described embodiment was with respect to fabrication of a field effect transistor which was oriented generally horizontally relative to the substrate. By way of example only, FIG. 9 depicts an alternate exemplary embodiment substrate fragment 10d wherein a field effect transistor 16d is oriented generally vertically relative to the substrate. Like numerals from the first described embodiment are utilized where appropriate, with differences being indicated with the suffix "d" or with different numerals. Transistor gate 28d and gate dielectric material 26d are depicted as comprising an annulus formed about channel region 14d. Source/drain region 20d comprises a semiconductive material projection 50 extending from channel region 22d. Projection 50 comprises a top surface 52 and side surfaces 54 over which gate dielectric material 26d (constituting an extension 31d thereof) is received. A contact opening 40d has been formed within dielectric layer 38d to at least a portion of gate dielectric material 26d extension 31d received over top surface 52 of source/drain region 20d. Exposing such as described above in any of the other exemplary embodiments has been conducted effective to transform extending portion 31d from a dielectric material to a conductive material.

The above-described exemplary preferred embodiments were with respect to methods of forming a conductive contact to a source/drain region through a contact opening in a dielectric layer received over the transistor gate and at least one source/drain region of the transistor. However, the invention also contemplates methods of forming a conductive contact to a source/drain region of a field effect transistor independent of such being conducted relative to a contact opening formed through a dielectric layer received over a transistor gate and a source/drain region. A preferred exemplary such method includes providing gate dielectric material intermediate a transistor gate and the channel region of a field effect transistor. At least some of the gate dielectric material extends to be received over at least one source/drain region of the field effect transistor. The gate dielectric material received over the one source/drain region is exposed to conditions effective to change it from being electrically insulative to be electrically conductive and in conductive contact with the one source/drain region. Preferred attributes are otherwise as described above independent of the provision of a dielectric layer 38 and a contact opening 40 therein.

Figure 11:
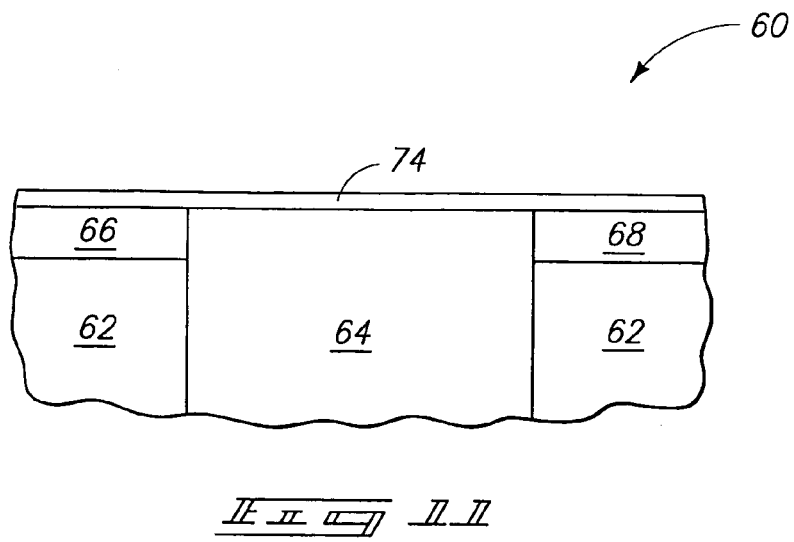
FIG. 11 is a view taken through line 11-11 in FIG. 10.

The invention also contemplates methods of forming a local interconnect. First exemplary preferred embodiments of the same are described initially with reference to FIGS. 10-14. A substrate fragment is indicated in FIGS. 10 and 11 generally with reference numeral 60. Such is depicted as comprising a bulk semiconductor substrate 62 having trench isolation regions 64 formed therein. Preferred attributes are otherwise as described above in connection with the first embodiment, and of course semiconductor-on-insulator substrates and fabrication, as well as other fabrication methods, are also contemplated whether existing or yet-to-be developed. Exemplary source/drain regions 66 and 68 (complete or in process of fabrication) of different transistors in process are shown relative to substrate material 62. Exemplary gate lines 70 and 72 are shown received over channel regions (not specifically designated with numerals) proximate source/drain regions 66 and 68, respectively. Source/drain regions 66 and 68 can be considered as first and second node regions, respectively, of semiconductor substrate 60. A gate dielectric material 74 has been provided intermediate at least one of transistor gates 70 and 72 to extend therefrom to be received between first and second node regions 66 and 68. In the depicted exemplary and preferred embodiment, gate dielectric material 74 extends to be received over at least one of first and second node regions 66 and 68, with gate dielectric material 74, as shown, extending to be received over both such first and second node regions.

Figure 12:
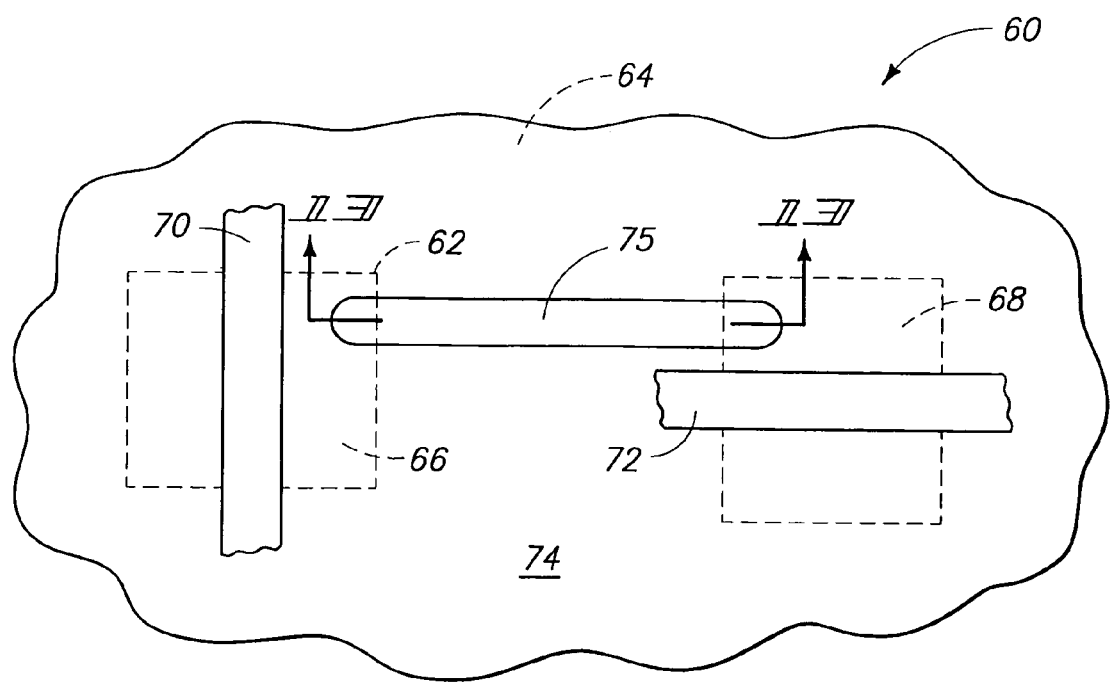
FIG. 12 is a view of the FIG. 10 substrate at a processing step subsequent to that depicted by FIG. 10.
Figure 13:
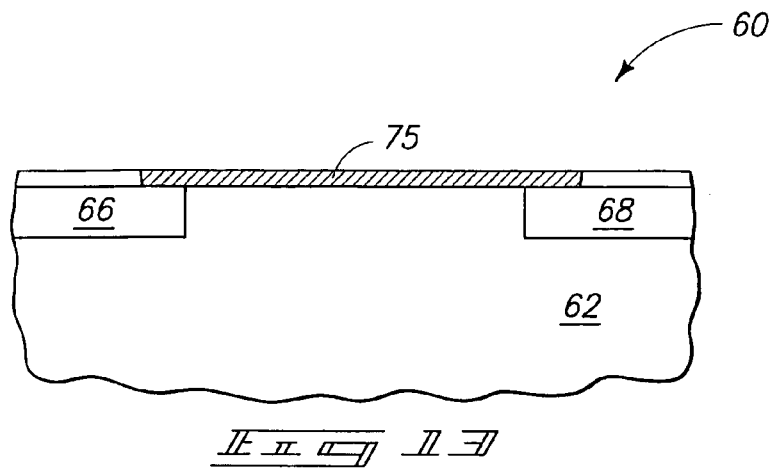
FIG. 13 is a view taken through line 13-13 in FIG. 12.
Figure 14:
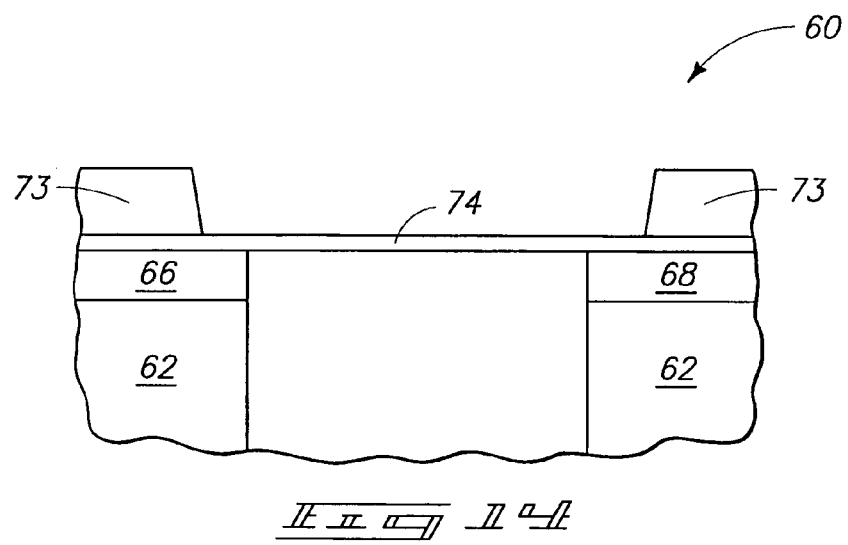
FIG. 14 is a view of the FIG. 11 substrate in process in accordance with an aspect of the invention.

Referring to FIGS. 12 and 13, gate dielectric material 74 received between first and second node regions 66 and 68, respectively, has been exposed to conditions effective to change it from being electrically insulative to being electrically conductive effective to form a local interconnect 75 electrically connecting first node region 66 and second node region 68. Preferred attributes of conducting the same are otherwise as described above in connection with the above-described other embodiments. Further by way of example only, one preferred manner of defining interconnect outline 75 is by masking, for example utilizing photoresist. By way of example only, FIG. 14 depicts a masking layer 73 having been deposited and patterned to define the local interconnect outlining 75 of FIGS. 12 and 13. Such may or may not be subsequently removed if other than photoresist depending upon the material utilized and the circuitry being fabricated, but will typically preferably be removed.

The above-described exemplary method of forming a local interconnect was where first and second node regions 66 and 68 comprise a source/drain region of one field effect transistor and a source/drain region of another field effect transistor. However, the invention also contemplates forming a local interconnect where one of the first and second node regions does not constitute any component of a field effect transistor, including any source/drain region. Of course, the invention contemplates forming a local interconnect where one of the first and second node regions is a source/drain region of one transistor, and the other of the first and second node regions is a gate of another transistor. Further, the invention also contemplates neither of first and second node regions 66 and 68 constituting any portion of a field effect transistor. Regardless and by way of example only, either of first and second node regions 66 and 68 might comprise any one or combination of the same or different conductively doped semiconductive material and/or at least one of an elemental metal (which includes alloys of elemental metals) and a conductive metal compound.

Figure 15:
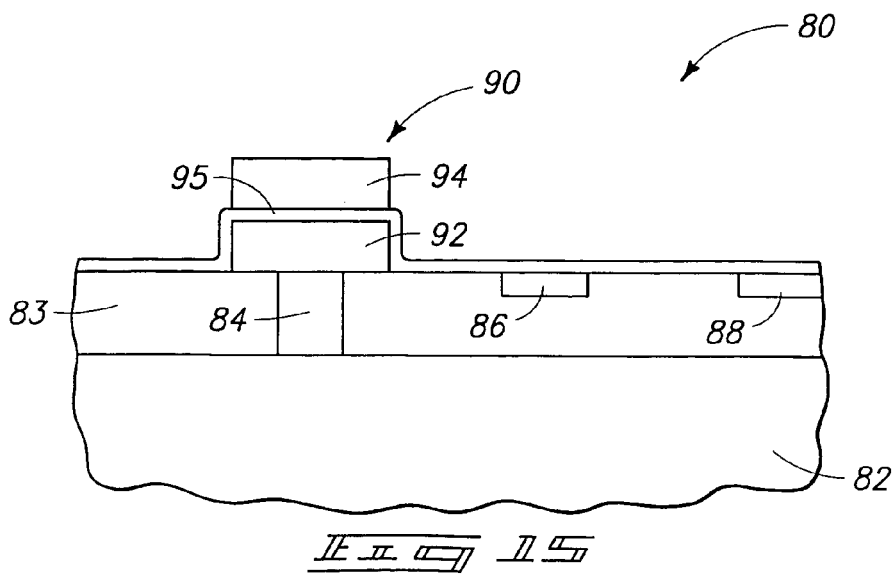
FIG. 15 is a diagrammatic cross section of a substrate fragment in process in accordance with an aspect of the invention.

By way of example only, exemplary additional implementations of methods of forming a local interconnect are described with reference to FIGS. 15 and 16 in connection with a substrate fragment 80. Referring to FIG. 15, substrate fragment 80 comprises semiconductor material 82 (i.e., monocrystalline silicon) having a dielectric layer 83 (i.e., BPSG) formed thereover. A conductive contact material 84 has been provided within dielectric layer 83, extending upwardly from semiconductive material 82. Exemplary first and second node regions 86 and 88, respectively, are depicted as being received within or on dielectric layer 83. Preferred attributes are preferably as described above in connection with the exemplary FIGS. 10-14 embodiment.

A capacitor 90 has been fabricated over dielectric layer 83. Such comprises a first capacitor electrode 92, a second capacitor electrode 94 and a capacitor dielectric material 95 received therebetween. Exemplary preferred materials for capacitor dielectric 95 include those described above for gate dielectric material 26. At least some of capacitor dielectric material 95 extends to be received between first and second node regions 86 and 88, respectively, of semiconductor substrate 80. In the depicted preferred embodiment, capacitor dielectric material 95 extends to be received over at least one of first and second node regions 86 and 88, with capacitor dielectric material 95 being received over both first and second node regions 86 and 88 in the exemplary embodiment.

Figure 16:
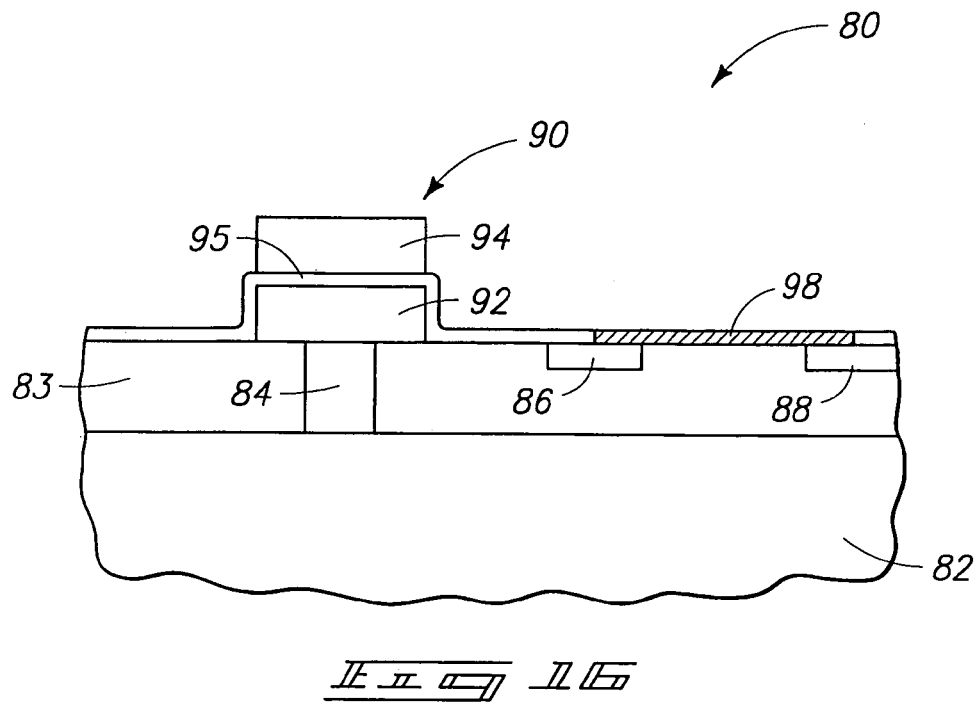
FIG. 16 is a view of the FIG. 15 substrate at a processing step subsequent to that depicted by FIG. 15.

Referring to FIG. 16, capacitor dielectric material 95 received between first and second node regions 86 and 88 has been exposed to conditions effective to change it from being electrically insulative to being electrically conductive to form a local interconnect 98 which electrically connects first node region 86 and second node region 88. Preferred attributes for conducting the same are otherwise as described above in connection with the above-described embodiments.

Figure 17:
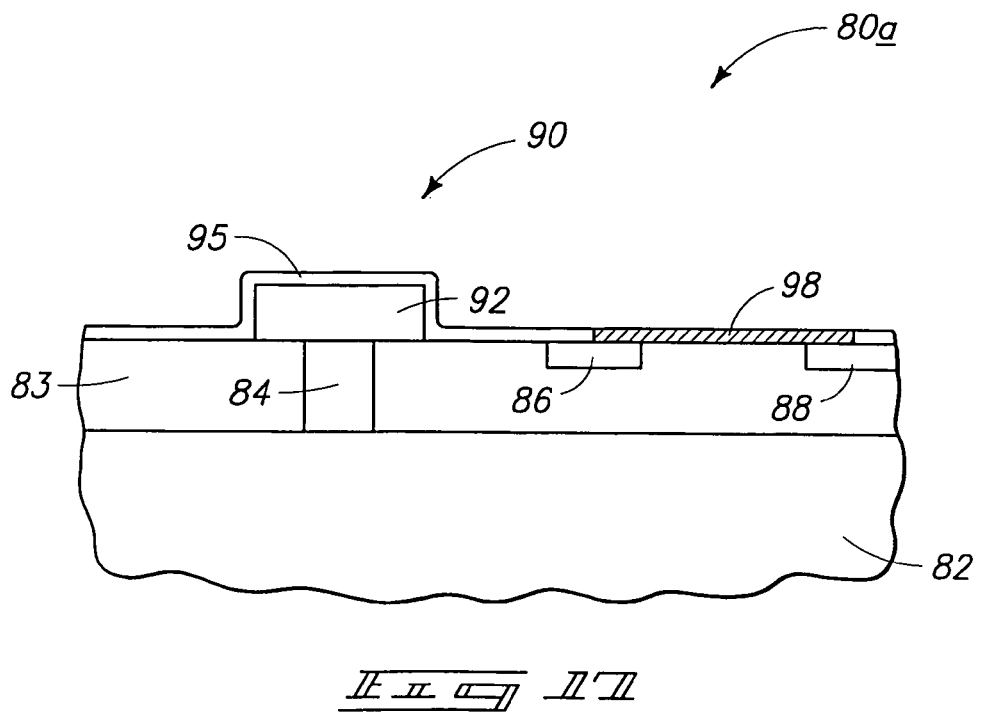
FIG. 17 is a diagrammatic cross section of a substrate fragment in process in accordance with an aspect of the invention.

The exemplary FIGS. 15 and 16 embodiment depicted formation of second capacitor electrode 94 prior to the exposing effective to form local interconnect 98. Of course, the invention contemplates forming a second capacitor electrode after such exposing. For example, and by way of example only, FIG. 17 depicts an alternate embodiment substrate fragment 80a wherein local interconnect 98 has been fabricated prior to the formation of second electrode 94 of the FIGS. 15 and 16 embodiment.

The above exemplary embodiments of FIGS. 10-17 depict forming the outline of the local interconnect before the exposing occurs. However, the invention also contemplates forming the outline of the local interconnect after the exposing occurs. For example and by way of example only, all of the exposed of the gate dielectric material and/or the capacitor dielectric material might be blanketly exposed to conditions effective to transform all of the same to a conductive material, followed by local interconnect patterning thereof (for example by photolithography and etch). Of course, the invention also contemplates exposing more than the ultimate local interconnect outline, but less than all the exposed gate dielectric material to the conditions, followed by local interconnect patterning thereof.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a local interconnect, comprising:
providing gate dielectric material intermediate a transistor gate and a channel region of a field effect transistor over a semiconductor substrate, at least some of the gate dielectric material extending to be received between first and second node regions of the semiconductor substrate; and
exposing the gate dielectric material received between the first and second node regions to conditions effective to change it from being electrically insulative to being electrically conductive and forming a local interconnect from the changed material which electrically connects the first and second node regions.

2. The method of claim 1 wherein the gate dielectric material extends to be received over at least one of the first and second node regions.

3. The method of claim 2 wherein the gate dielectric material extends to be received over both the first and second node regions.

4. The method of claim 1 wherein at least one of the first and second node regions comprises conductively doped semiconductive material.

5. The method of claim 4 wherein both of the first and second node regions comprise conductively doped semiconductive material.

6. The method of claim 1 wherein at least one of the first and second node regions comprises at least one of an elemental metal and a conductive metal compound.

7. The method of claim 6 wherein both of the first and second node regions comprise at least one of an elemental metal and a conductive metal compound.

8. The method of claim 1 wherein one of the first and second node regions comprises conductively doped semiconductive material, and the other of the first and second node regions comprises at least one of an elemental metal and a conductive metal compound.

9. The method of claim 1 wherein the local interconnect is not in direct electrical connection with any component of the field effect transistor.

10. The method of claim 1 wherein the extending gate dielectric material has a dielectric constant of at least 8.

11. The method of claim 1 wherein the exposing forms the local interconnect to comprise a conductive metal nitride.

12. The method of claim 11 wherein the exposing forms the local interconnect to comprise an elemental metal followed by formation of the conductive metal nitride.

13. The method of claim 1 wherein the exposing forms the extending material to comprise a conductive metal boride.

14. The method of claim 1 wherein the exposing forms the local interconnect to comprise a conductive metal silicide.

15. The method of claim 14 wherein the gate dielectric material received between the first and second node regions is formed on silicon, the silicide being formed by reaction of metal of the gate dielectric material received between the first and second node regions with silicon on which the gate dielectric material is received between the first and second node regions.

16. The method of claim 14 wherein the conductive metal silicide is formed by exposure to a silicon-comprising atmosphere.

17. The method of claim 1 wherein the exposing forms the local interconnect to comprise an elemental metal.

18. The method of claim 1 wherein the extending gate dielectric material comprises a metal oxide.

19. The method of claim 18 wherein the metal oxide comprises hafnium oxide.

20. The method of claim 18 wherein the metal oxide comprises aluminum oxide.

21. The method of claim 18 wherein the metal oxide comprises tantalum oxide.

22. The method of claim 18 wherein the metal oxide comprises titanium oxide.

23. The method of claim 18 wherein the metal oxide comprises zirconium oxide.

24. The method of claim 1 wherein the extending gate dielectric material comprises a metal silicate.

25. The method of claim 1 wherein the exposing forms the local interconnect to be homogeneous.

26. The method of claim 1 wherein the exposing forms the local interconnect to not be homogeneous.

27. The method of claim 26 wherein the exposing forms the local interconnect to comprise a conductive metal nitride received over a conductive metal silicide.

28. The method of claim 27 wherein the gate dielectric material received between the first and second node regions is formed on silicon, the silicide being formed by reaction of metal of the gate dielectric material received between the first and second node regions with silicon on which the gate dielectric material is received between the first and second node regions.

29. The method of claim 1 wherein the exposing is void of exposure to plasma.

30. The method of claim 1 wherein the exposing comprises ion implantation.

31. A method of forming a local interconnect, comprising:
providing gate dielectric material intermediate a transistor gate and a channel region of a field effect transistor over a semiconductor substrate, at least some of the gate dielectric material extending to be received between first and second node regions of the semiconductor substrate; and
exposing the gate dielectric material received between the first and second node regions to conditions effective to change it from being electrically insulative to being electrically conductive and forming a local interconnect from the changed material which electrically connects the first and second node regions, one of the first and second node regions comprising a source/drain region of the field effect transistor.

32. The method of claim 31 wherein the other of the first and second node regions comprises conductively doped semiconductive material.

33. The method of claim 31 wherein the other of the first and second node regions comprises at least one of an elemental metal and a conductive metal compound.

34. The method of claim 31 wherein the other of the first and second node regions comprises a source/drain region of another field effect transistor.

35. A method of forming a local interconnect, comprising:
providing gate dielectric material intermediate a transistor gate and a channel region of a field effect transistor over a semiconductor substrate, at least some of the gate dielectric material extending to be received between first and second node regions of the semiconductor substrate; and
exposing the gate dielectric material received between the first and second node regions to conditions effective to change it from being electrically insulative to being electrically conductive and forming a local interconnect from the changed material which electrically connects the first and second node regions, an outline of the local interconnect being formed before the exposing.

36. The method of claim 35 wherein the exposing is through a patterned opening formed within a masking layer.

37. The method of claim 36 wherein the masking layer comprises photoresist.

38. A method of forming a local interconnect, comprising:
providing gate dielectric material intermediate a transistor gate and a channel region of a field effect transistor over a semiconductor substrate, at least some of the gate dielectric material extending to be received between first and second node regions of the semiconductor substrate; and
exposing the gate dielectric material received between the first and second node regions to conditions effective to change it from being electrically insulative to being electrically conductive and forming a local interconnect from the changed material which electrically connects the first and second node regions, an outline of the local interconnect being formed after the exposing.

39. A method of forming a local interconnect, comprising:
providing gate dielectric material intermediate a transistor gate and a channel region of a field effect transistor over a semiconductor substrate, at least some of the gate dielectric material extending to be received between first and second node regions of the semiconductor substrate; and
exposing the gate dielectric material received between the first and second node regions to conditions effective to change it from being electrically insulative to being electrically conductive and forming a local interconnect from the changed material which electrically connects the first and second node regions, the exposing comprising exposure to plasma.

40. The method of claim 39 wherein the gate dielectric material received between the first and second node regions comprises a metal oxide, and the plasma exposure comprises at least some exposure to a reaction-inert material which breaks metal-oxygen bonds of the metal oxide.

41. The method of claim 39 wherein the gate dielectric material received between the first and second node regions comprises a metal silicate, and the plasma exposure comprises at least some exposure to a reaction-inert material which breaks metal-oxygen bonds of the metal silicate.

42. The method of claim 39 wherein the exposing comprises:
depositing another material over the gate dielectric material received between the first and second node regions, the another material being different in composition from that of the gate dielectric material received between the first and second node regions, the gate dielectric material received between the first and second node regions and the another material being proximate one another at an interface, the gate dielectric material received between the first and second node regions and the another material as being proximate one another at the interface being capable of reacting with one another at some minimum reaction temperature when in an inert non-plasma atmosphere at a pressure;
providing the interface at a processing temperature which is at least 50° C. below the minimum reaction temperature and at the pressure; and
with the interface at the processing temperature and at the pressure, exposing the substrate to a plasma effective to impart a reaction of the gate dielectric material received between the first and second node regions with the another material to form the local interconnect to comprise a reaction product third material.

43. The method of claim 42 wherein the exposing comprises ion implantation.

* * * * *